United States Patent [19]

Dehara

[11] Patent Number: 4,775,977
[45] Date of Patent: Oct. 4, 1988

[54] PATTERN GENERATING APPARATUS

[75] Inventor: Masayoshi Dehara, Tokyo, Japan

[73] Assignee: Ando Electric Co., Ltd., Tokyo, Japan

[21] Appl. No.: 929,874

[22] Filed: Nov. 17, 1986

[30] Foreign Application Priority Data

Nov. 19, 1985 [JP] Japan ................... 60-259349

[51] Int. Cl.⁴ ............................................ G01R 31/28
[52] U.S. Cl. .................................................... 371/27
[58] Field of Search ............... 371/25, 27, 21, 20; 364/200, 900

[56] References Cited

U.S. PATENT DOCUMENTS

| | | | |
|---|---|---|---|
| 3,952,253 | 4/1976 | De Volp et al. | 328/63 |
| 4,131,855 | 12/1978 | Hamagawa | 328/129.1 |
| 4,306,190 | 12/1981 | Beckwith et al. | 307/271 |
| 4,450,560 | 5/1984 | Conner | 371/27 |
| 4,523,289 | 6/1985 | Soma et al. | 377/20 |
| 4,555,663 | 11/1985 | Shimizu | 371/27 |
| 4,573,175 | 2/1986 | Cressey | 307/271 |
| 4,584,683 | 4/1986 | Shimizu | 371/27 |
| 4,680,479 | 7/1987 | Alonso | 307/271 |
| 4,719,375 | 1/1988 | Martin | 328/63 |

FOREIGN PATENT DOCUMENTS

| | | | |
|---|---|---|---|
| 0208049 | 1/1987 | European Pat. Off. | 307/269 |
| 0067869 | 4/1985 | Japan | 307/269 |
| 0096023 | 5/1985 | Japan | 307/269 |
| 0075615 | 4/1986 | Japan | 307/269 |
| 2070827 | 9/1981 | United Kingdom | 307/269 |

Primary Examiner—Michael R. Fleming
Attorney, Agent, or Firm—Seidel, Gonda, Lavorgna & Monaco

[57] ABSTRACT

A pattern generating apparatus for testing IC device includes an input/output mode memory, a pattern memory storing a driver pattern and an expected pattern, a driver pattern generator for outputting the driver pattern in response to the outputs of the pattern memory and the input/output mode memory, and an expected pattern generator for generating the expected pattern. The driver pattern is applied to the IC device whose output pattern is compared with the expected pattern in a comparison/decision circuit to decide whether the IC device is to be satisfactory or not. The pattern memory is of two-bit structure so that the driver pattern and the expected pattern can be varied in respect to the waveform in dependence on combinations of the two bits.

5 Claims, 4 Drawing Sheets

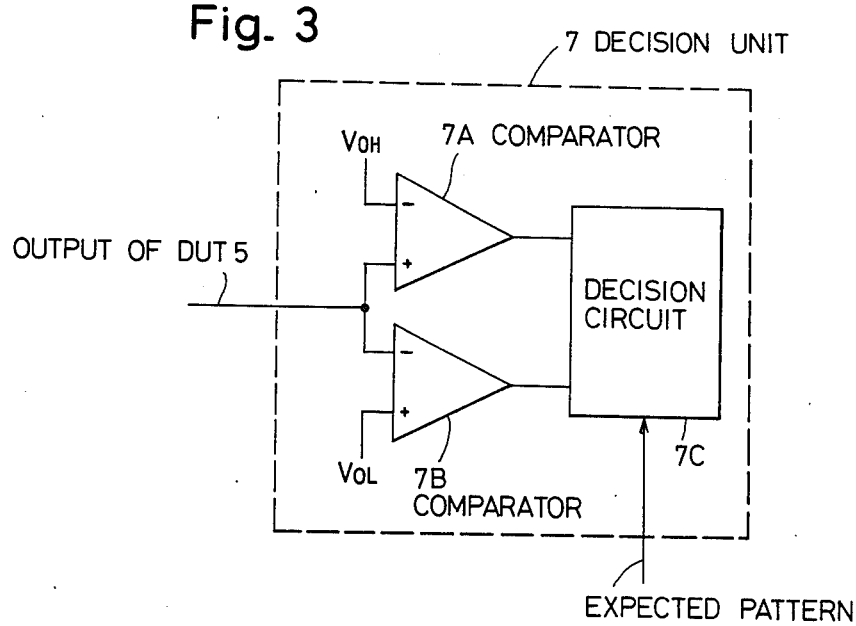
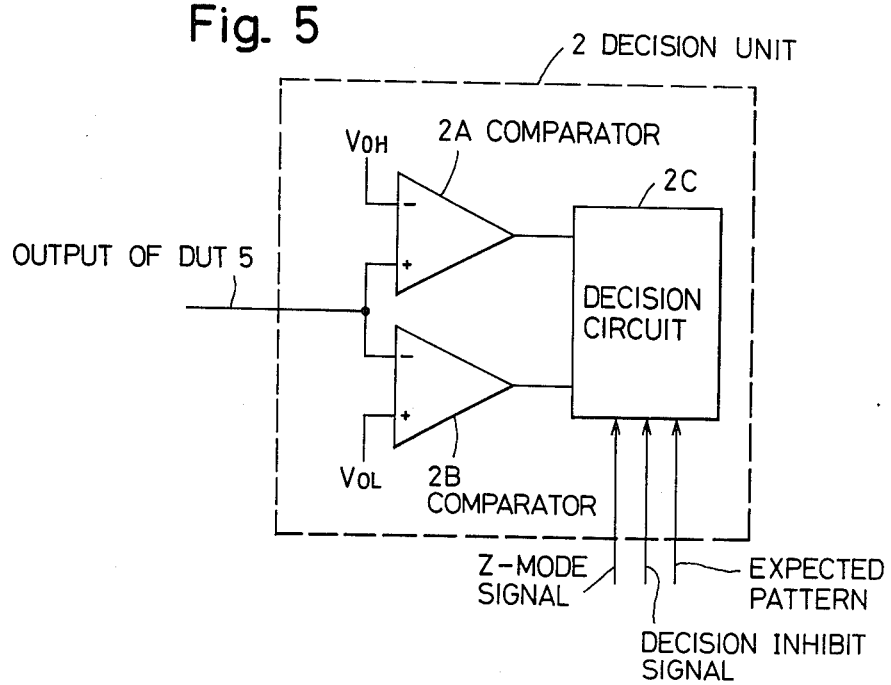

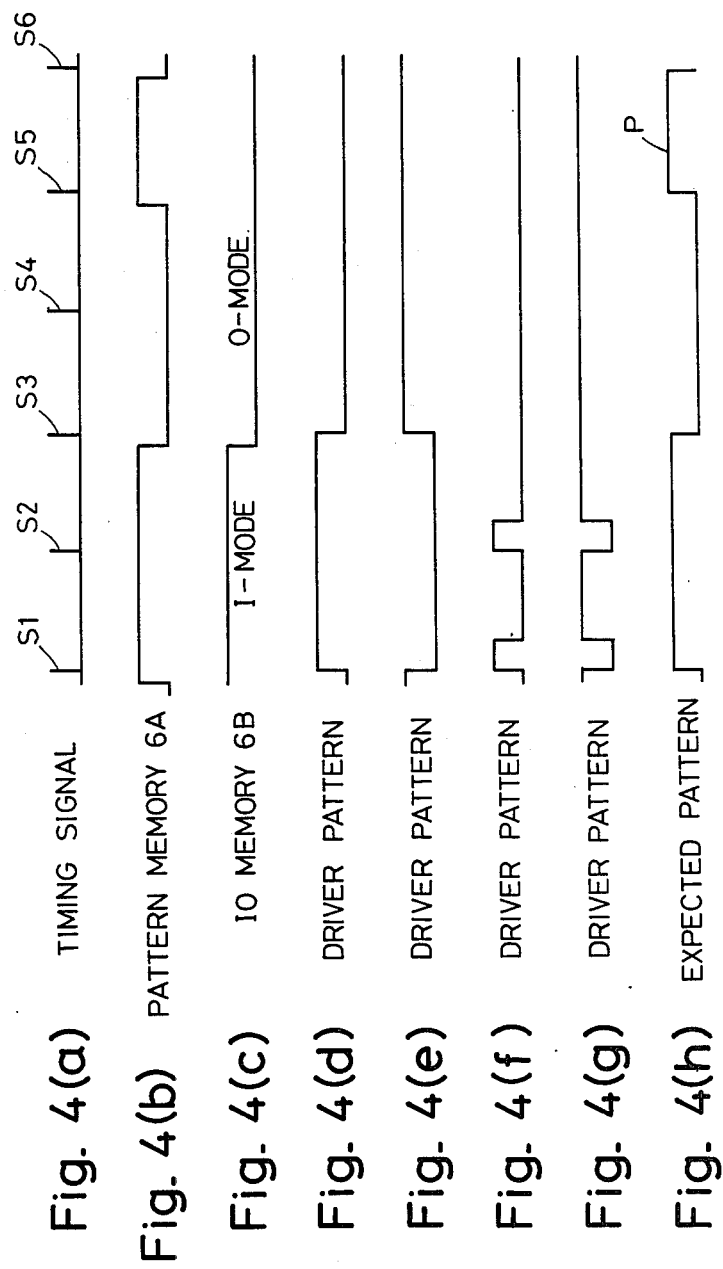

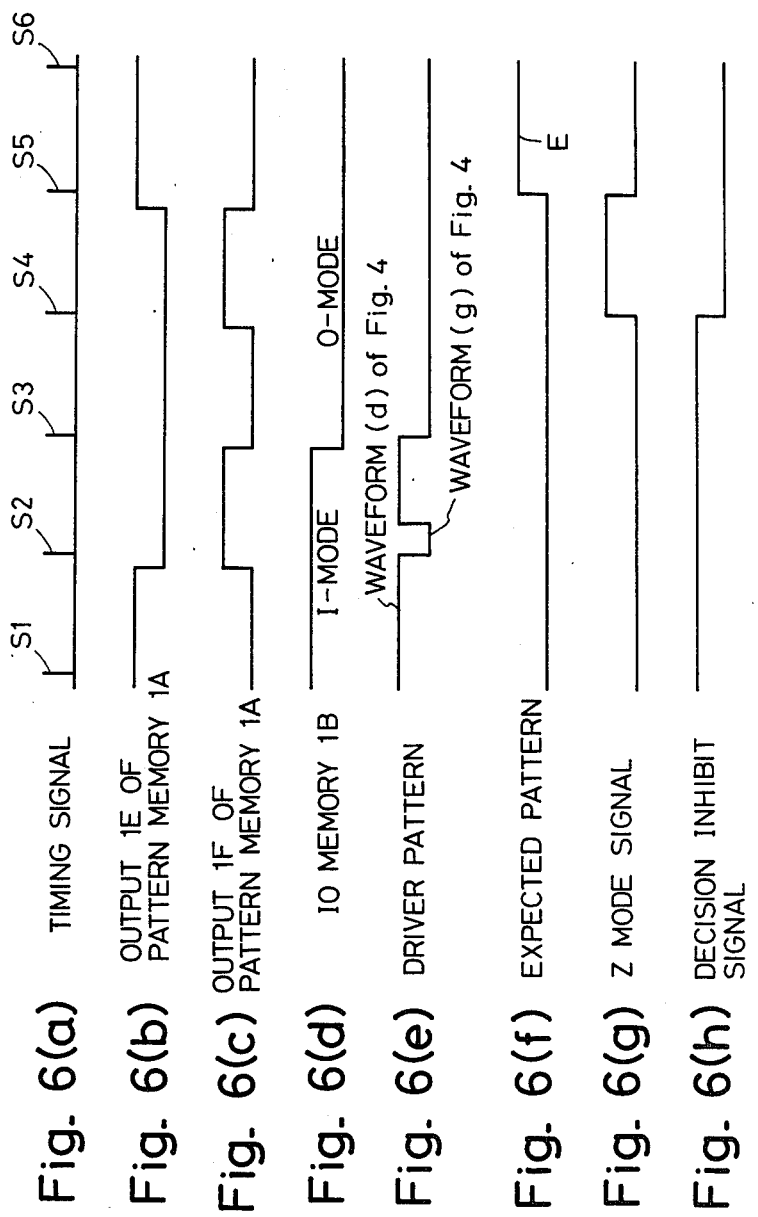

PATTERN GENERATING APPARATUS

BACKGROUND OF THE INVENTION

1. Field of the Invention

The present invention relates to a pattern generating apparatus for an IC tester destined for testing an electronic device such as an integrated circuit or IC device (hereinaftersrer referred to as DUT in an abbreviation of device under test). More particularly, the invention concerns a pattern generating apparatus which generates a driver pattern applied to a DUT and an expected pattern to be utilized as a reference pattern for comparison with the output pattern produced by the DUT in response to the input driver pattern, wherein decision of the DUT as to the performance thereof is made on the result of the comparison.

2. Description of the Prior Art

For having a better understanding of the present invention, description will first be made of a typical one of the hitherto known relevant techniques by referring to FIG. 2 of the accompanying drawings.

In the figure, a reference numeral 3 denotes an input-/output port (hereinafter referred to simply as IO port), 4 denotes a CPU (an abbreviation of central processing unit), 6 denotes a pattern generator, and a reference numeral 7 denotes a decision unit. With the arrangement shown in FIG. 2, an IC tester for testing a pin of an IC DUT (IC device under test) 5 is realized.

The pattern generator 6 is composed of a pattern memory 6A, an input/output mode memory or IO memory 6B, a driver pattern generating circuit 6C and an expected pattern generating circuit 6D. The pattern memory 6A produces an output of one bit which is applied to both the driver pattern generating circuit 6C and the expected pattern generating circuit 6D. The IO memory 6B produces an output of one bit which is applied only to the driver pattern generating circuit 6C. The driver pattern generating circuit 6C samples the output of the pattern memory 6A, wherein the sampled output of the latter being converted into a waveform required for testing the DUT 5 and subsequently applied to the IO port 3. In this conjunction, the CPU 4 has placed various modes of waveform in the driver pattern generating circuit 6C in precedence to execution of the test. The driver pattern generating circuit 6C samples the output signal of the IO memory 6B, the sampled signal being inputted to the IO port 3. On the other hand, the expected pattern generating circuit 6D samples the output signal of the pattern memory 6A, wherein the sampled signal is supplied to the decision unit 7 as the expected pattern (reference pattern).

The DUT 5 is connected to an IO terminal of the IO port 3. When the IO pattern produced by the driver pattern generating circuit 6C is logic "1", the IO terminal is set to the input (I) mode, allowing the IO port 3 to transmit the driver pattern to the DUT 5. On the other hand, when the IO pattern is logic "0", the IO terminal is set to the output (O) mode, whereby the output pattern generated by the DUT 5 is transmitted to the decision unit 7.

The pin of the DUT 5 under test can be selectively set to I-mode, O-mode and Z-mode. In the I-mode of the pin, the DUT 5 is set to the input mode. In the O-mode, the DUt 5 is set to the output mode, while the DUT 5 is set to a high-impedance state in the Z-mode.

The decision unit 7 compares the expected pattern with the output pattern of the DUT 5 to make decision as to whether the DUT 5 is to be satisfactory or not.

A circuit configuration of the decision unit 7 is shown in FIG. 3. In the figure, reference characters 7A and 7B denote comparators, respectively, and 7C denotes a decision circuit. Further, symbols $V_{OH}$ and $V_{OL}$ denote reference potentials of high and low levels, respectively, utilized for comparison.

The comparator 7A compares the high potential of the DUT 5 with the high reference potential $V_{OH}$, the result of the comparison being supplied to the decision circuit 7C. On the other hand, the comparator 7B compares the low reference voltage $V_{OL}$ with the low potential of the DUT 5, wherein the result of the comparison is applied to the decision circuit 7C. The decision circuit 7C in turn compares the expected pattern with the output of the comparator 7A when the expected pattern is logic "1", while the expected pattern is compared with the output of the comparator 7B in case the expected pattern is logic "0". In this way, decision is made as to whether the DUT 5 is to be satisfactory or not.

Next, operation of the pattern generating apparatus shown in FIG. 2 will be described by referring a timing-/waveform diagrams shown in FIG. 4.

FIG. 4 illustrates at (a) a timing signal including timing pulses S1, ..., S6, .... This timing signal (a) is supplied to both the driver pattern generating circuit 6C and the expected pattern generating circuit 6D to be used for sampling the outputs of the pattern memory 6A and the IO memory 6B, respectively. Accordingly, the pulse repetition period of the timing signal (a) shown in FIG. 4 at (a) determines the repetition period of the driver pattern and the expected pattern.

Shown at (b) in FIG. 4 is an output waveform of the pattern memory 6A which waveform assumes logic level "1" in response to the timing pulse signal S1, S2 and S5, respectively.

There is shown at (c) of FIG. 4 an output waveform of the IO memory.

Finally, FIG. 4 shows at rows (d) to (g) four different waveforms of the driver pattern which may be selectively applied to the DUT 5. For selecting one of the waveforms (d) to (g) shown in FIG. 4, the CPU 4 sets a waveform mode corresponding to a selected one of the four waveforms (d) to (g) at the driver pattern generating circuit 6C in precedence to execution of the test. Accordingly, when the DUT 5 is being tested, the driver pattern generating circuit outputs 6C continuously the driver pattern of the selected one waveform.

Shown in FIG. 4 at (d) is a waveform which results from the sampling of the waveform shown at (d) in FIG. 4 by the timing signal shown at (a) in FIG. 4. The waveform shown at (e) in FIG. 4 corresponds to the inversion of the waveform shown in FIG. 4 at (d).

Shown at (f) in FIG. 4 is a waveform which is obtained through a logic operation of the waveform shown at (c) in FIG. 4, while the waveform shown at (g) corresponds to the inversion of the waveform shown at (f) in FIG. 4.

Shown in FIG. 4 at (h) is an output waveform of the expected pattern generating circuit 6D which is derived by sampling the waveform shown at (b) with the timing signal shown at (a) in FIG. 4.

The decision unit 7 compares the expected pattern shown at (h) in FIG. 4 with the output of the comparator shown in FIG. 3 which corresponds to the expected pattern (h) to thereby make decision as to whether the DUT 5 is acceptable or not.

As will be seen from the above description, the hitherto known apparatus suffers difficulties mentioned below.

When it is desired that the driver pattern of another waveform is to be applied to the DUT 5 during a period intervening between the timing pulses S1 and S2, the CPU 4 has to set the waveform mode to replace the current one at the driver pattern generating circuit 6C every time one test is completed.

Further, when there is necessity of inhibiting the decision as to the acceptability of the DUT 5 in the hitherto known apparatus, a memory destined for inhibiting such decision has to be additionally incorporated in the apparatus.

SUMMARY OF THE INVENTION

Accordingly, it is an object of the present invention is to provide a pattern generating apparatus which is immune to the drawbacks of the prior art apparatus described above.

In view of the above and other objects which will be more apparent as description proceeds, it is proposed according to an aspect of the present invention that the output pattern of the pattern memory is composed of two bits, and that these two bits are combined with the IO pattern to allow the driver patterns resulting from combinations of different waveforms to be selectively generated during a time span between the timing pulses (S1) and (S3). According to another aspect of the invention, arrangement is made such that the acceptability decision of the DUT can be inhibited when the DUT is in the I-mode, while the decision is effectuated at any given pattern position in the O-mode of the DUT.

The above and other object, features and advantages of the present invention will be more apparent upon consideration of the following description of the preferred embodiments thereof taken in conjunction with the accompanying drawings.

BRIEF DESCRIPTION OF THE DRAWINGS

FIG. 3 shows a circuit configuration of a decision unit (7) employed in the apparatus shown in FIG. 2;

FIG. 4 is a view showing timing/waveform diagrams for illustrating operation of the system shown in FIG. 2;

FIG. 5 is a block diagram showing a circuit configuration of a decision unit (2) employed in the system shown in FIG. 1; and FIG. 6 is a view showing timing/waveform diagrams for illustrating operation of the system shown in FIG. 1.

DESCRIPTION OF THE PREFERRED EMBODIMENTS

Now, the invention will be described in detail in conjunction with a preferred embodiment by first referring to FIG. 1.

Figure 1:
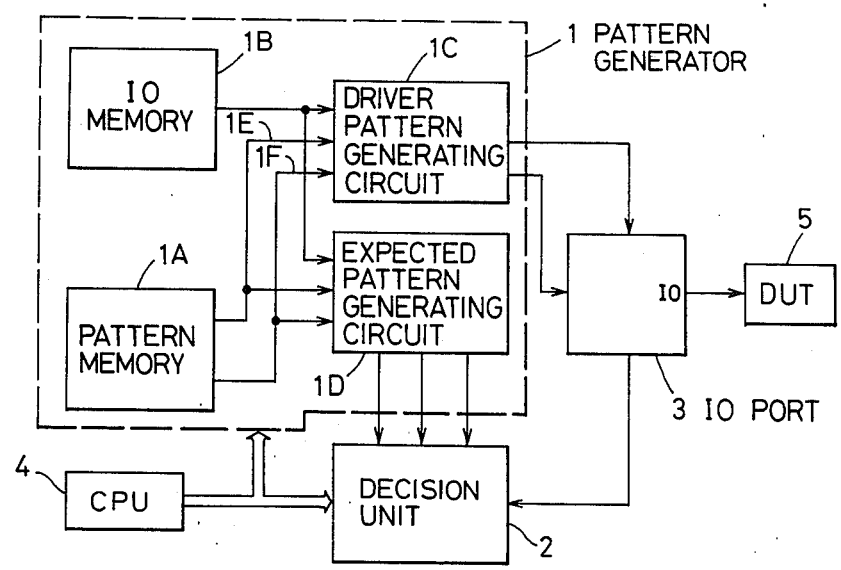
FIG. 1 is a view showing in a block diagram a general arrangement of a pattern generating apparatus according to an exemplary embodiment of the present invention.

In FIG. 1, a reference numeral 1 denotes a pattern generator apparatus and 2 denotes a decision unit. The pattern generator apparatus 1 is composed of a pattern memory 1A, and IO memory 1B, a driver pattern generating circuit 1C and an expected pattern generating circuit 1D. The pattern memory 1A is so designed to produce an output signal consisting of two bits, which output signal is applied to both the driver pattern generating circuit 1C and the expected pattern generating circuit 1D.

Figure 2:
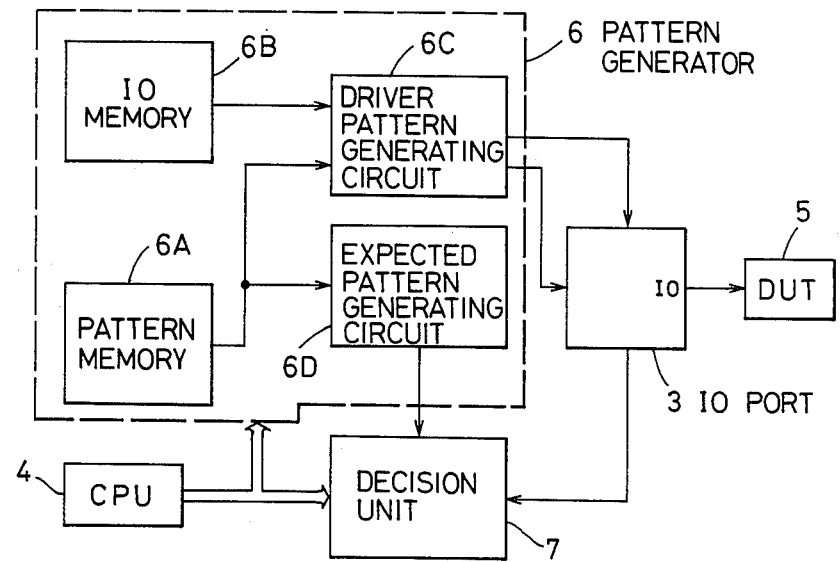
FIG. 2 is a view showing in a block diagram a structure of a hitherto known pattern generating apparatus.

The IO memory memory 1B shown in FIG. 1 is identical with the IO memory 6B shown in FIG. 2. The output of the IO memory 1B is supplied to the inputs of the driver pattern generating circuit 1C and the expected pattern generating circuit 1D, respectively.

The driver pattern generating circuit 1C changes over the waveform modes in dependence on the combination of two bits outputted from the pattern memory 1A when the output of the IO memory 1B is "1", and generates a combination of waveforms illustrated at (d) to (g) in FIG. 4. Additionally, the driver pattern generating circuit 1C produces the IO pattern as with the case of the driver pattern generating circuit 6D shown in FIG. 2.

The expected pattern generating circuit 1D operates to decode the two-bit output of the pattern memory 1A when the output of the IO memory 1B is logic "0" and generates the expected pattern, the Z-mode signal and a decision inhibit signal in dependence on the result of the decoding, the signal output from the expected pattern generating circuit 1D being supplied to the decision unit 2. In this connection, it should be mentioned that the expected pattern produced by the expected pattern generating circuit 1D shown in FIG. 1 is same as the output pattern of the expected pattern generating circuit 6D shown in FIG. 2.

The decision unit 2 can serve to check the Z-mode state of the DUT 5 in response to the Z-mode signal and can stop the decision as to the acceptability of the DUT 5 in response to the decision inhibit signal in addition to the same function as that of the decision unit 7 shown in FIG. 2.

Next, referring to FIG. 5, the decision unit 2 will be described. In the figure, reference symbols 2A and 2B denote comparators, respectively, and 2C denotes a decision circuit. It should be mentioned that the comparators 2A and 2B serve to same functions as those of the comparators 7A and 7B shown in FIG. 3B. The decision circuit 2C is so designed to inhibit the decision as to the acceptability of the DUT 5 and make decision as to whether the Z-mode state of the DUT 5 is within tolerance range in addition to the same function as that of the decision circuit 7C shown in FIG. 3. When the Z-mode signal is applied, the decision circuit 2C compares the outputs of the comparators 2A and 2B with the expected pattern to thereby decide the permissibility of the function of the DUT 5 in the Z-mode state.

Now, operation of the system shown in FIG. 1 will be described by referring to the timing/waveform diagram shown in FIG. 6.

FIG. 6 shows at (a) a timing signal which is same as the one shown at (a) in FIG. 4. This timing signal is supplied to both the driver pattern generating circuit 1C and the expected pattern generating circuit 1D.

Shown at (b) and (c) in FIG. 6 are, respectively, the output signals 1E and 1F of the pattern memory 1A which are supplied to both the driver pattern generating circuit 1C and the expected pattern generating circuit 1D.

Shown at (d) in FIG. 6 is the output waveform of the IO memory 1B which is same as the one illustrated at (c) in FIG. 4. The output waveform (d) of the IO memory 1B is supplied to both the driver pattern generating circuit 1C and the expected pattern generating circuit 1D.

Shown in FIG. 6 at (e) is a waveform of the driver pattern which is generated by the driver pattern generating circuit 1C in correspondence to the combination of the waveforms shown at (b) and (c) in FIG. 6 during a period in which the waveform shown at (d) is indicating the I-mode. As will be seen from the waveform (e) shown in FIG. 6, waveform is changed to a combined waveform of the waveforms (d) and (f) shown in FIG. 4 during a period between the timing pulses S1 and S3. It will be understood that another combined waveform can be realized for the driver pattern by varying the data of the pattern memory 1A. In this manner, according to the teaching of the present invention, the driver pattern having a waveform corresponding to a given combination of different waveforms can be generated in synchronism with the timing signal shown at (a) in FIG. 6.

Shown at (f) to (h) in FIG. 6 are signal waveforms which are generated by the expected pattern generating circuit 1D in correspondence to combinations of the waveforms shown at (b) and (c) in FIG. 6 during a period in which the waveform shown at (d) in FIG. 6 represents the O-mode. More specifically, the waveform shown at (f) in FIG. 6 is that of the expected pattern which is logic "1" when the waveforms shown at (b) and (c) are at levels "1" and "0", respectively, and which corresponds to the expected pattern P shown at (h) in FIG. 4. The waveform (f) of FIG. 6 is supplied to the decision unit 2.

Shown at (g) in FIG. 6 is a waveform of the Z-mode signal which is outputted when the signal (d) of FIG. 6 indicates the O-mode and when the signals (b) and (c) of FIG. 6 are logic "0" and "1", respectively. When this waveform (g) is supplied to the decision unit 2, the latter performs comparison of the expected pattern of logic "0" with the output signals of two comparators 2A and 2B, respectively.

Finally shown at (h) in FIG. 6 is a waveform of the decision inhibit signal which assumes a level of logic "1" when the signal (d) of FIG. 6 indicates the I-mode. Further, the decision inhibit signal is logic "1", when the signals (b) and (c) of FIG. 6 are logic "0", respectively.

According to the teaching of the invention that the output of the pattern memory is realized in a two-bit structure, advantageous effects mentioned below can be obtained.

(i) Since the waveform mode can be changed over in accordance with combinations of two bits outputted from the pattern memory, the drive pattern of various waveforms each of which corresponds to one of combinations of different waveforms can be generated in synchronism with the timing signal shown in FIG. 6 at (a) in the course of one and the same test cycle.

(ii) Since the Z-mode is established in dependence on the combination of two bits of the pattern memory 1A according to the invention, it is possible to test the Z-mode state of the DUT 5 with a simplified structure.

(iii) Since the decision inhibit signal shown at (h) in FIG. 6 is generated as a function of combination of two-bits of the pattern memory 1A and the output signal of the IO memory 1B, the decision as to the acceptability of the DUT 5 can be inhibited with a simplified structure.

The many features and advantages of this invention are apparent from the detailed description and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to without departing from the scope of the invention.

I claim:

1. A pattern generating apparatus, comprising an input/output memory for storing a binary input/output pattern, said input/output memory having an output, a pattern memory for storing two binary patterns, said pattern memory having two outputs, a driver pattern generating circuit supplied as inputs thereto with the two outputs of the pattern memory and the output of the input/output memory for producing at the output thereof a driver pattern to be supplied to an electronic circuit to be tested, an expected pattern generating circuit supplied as inputs thereto with the two outputs of the pattern memory and the output of the input/output memory for producing an expected pattern for use as a reference relative to the actual pattern returned from the electronic circuit to be tested, said driver pattern generating circuit being operated when the output of the input/output memory indicates an input-mode so as to generate said driver pattern based on a combination of the two binary patterns from the pattern memory, said expected pattern generating circuit being operated when the output of said input/output memory indicates an output-mode so as to generate said expected pattern based on the combination of the two binary patterns from the pattern memory.

2. A pattern generating apparatus according to claim 1, said apparatus being used for testing an electronic device, wherein said driver pattern is applied to said device under test, further including decision means for comparing the output pattern signal produced by said electronic device in response to said driver pattern with said expected pattern to decide whether said device is acceptable or not.

3. A pattern generating apparatus according to claim 2, further including means for generating an inhibit signal in dependence on a combination of the two outputs of said pattern memory and the output of said input/output memory to inhibit operation of said decision means.

4. A pattern generating apparatus according to claim 2, further including means for generating a Z-mode signal in dependence on a combination of said two outputs of said pattern memory to check said electronic device in a high-impedance state thereof.

5. A pattern generating apparatus for use in testing an electronic device by applying a driver pattern signal thereto, comprising:
means for producing a coded signal comprising multiple bits in parallel,
a driver pattern generating circuit for producing, when enabled, a driver pattern signal in response to a preselected value of said multiple bits,
an expected pattern generating circuit for producing, when enabled, and expected pattern signal in response to a preselected value of said multiple bits,
means for producing a signal for alternately enabling said driver pattern and expected pattern generating circuits,
means for applying the driver pattern signal to said electronic device, and
means for comparing the expected pattern signal with an output of the electronic device.

* * * * *